United States Patent
Huang

(10) Patent No.: US 10,562,715 B2
(45) Date of Patent: Feb. 18, 2020

(54) METHOD AND APPARATUS TO DIAGNOSE A LINEAR SYNCHRONOUS MOTOR SYSTEM

(71) Applicant: MagneMotion, Inc., Devens, MA (US)

(72) Inventor: Yuhong Huang, Acton, MA (US)

(73) Assignee: Magnemotion, Inc., Devens, MA (US)

( * ) Notice: Subject to any disclaimer, the term of this patent is extended or adjusted under 35 U.S.C. 154(b) by 352 days.

(21) Appl. No.: 15/701,578

(22) Filed: Sep. 12, 2017

(65) Prior Publication Data
US 2019/0077608 A1 Mar. 14, 2019

(51) Int. Cl.
| | | |
|---|---|---|
| B65G 43/02 | (2006.01) | |
| B65G 35/06 | (2006.01) | |
| B65G 54/02 | (2006.01) | |
| B60L 15/00 | (2006.01) | |
| B65G 43/06 | (2006.01) | |
| B60L 13/10 | (2006.01) | |
| H02P 6/00 | (2016.01) | |
| G05B 19/042 | (2006.01) | |
| G05B 23/02 | (2006.01) | |

(52) U.S. Cl.
CPC .............. *B65G 43/02* (2013.01); *B60L 13/10* (2013.01); *B60L 15/005* (2013.01); *B65G 35/06* (2013.01); *B65G 43/06* (2013.01); *B65G 54/02* (2013.01); *G05B 19/0421* (2013.01); *G05B 23/0205* (2013.01); *H02P 6/006* (2013.01)

(58) Field of Classification Search
CPC ........ B60L 13/10; B60L 15/005; B60L 13/03; B65G 35/06; B65G 43/02; B65G 43/06; B65G 54/02; H02P 6/006; H02P 29/024; H02P 25/06; H02K 11/21; B61L 25/025; G01L 5/0028
See application file for complete search history.

(56) References Cited

U.S. PATENT DOCUMENTS

| | | | | | |
|---|---|---|---|---|---|
| 5,589,769 | A | * | 12/1996 | Krahn | ..................... G01D 5/145 324/207.21 |
| 6,011,389 | A | * | 1/2000 | Masreliez | ............ G01D 5/2046 324/207.17 |
| 6,011,508 | A | * | 1/2000 | Perreault | ................. B61L 3/225 246/122 R |

(Continued)

FOREIGN PATENT DOCUMENTS

| | | |
|---|---|---|
| EP | 0735653 A1 | 10/1996 |
| WO | 03/105324 A1 | 12/2003 |

OTHER PUBLICATIONS

Extended European Search Report dated Feb. 22, 2019; Application No. 18192894.6—(6) pages.

*Primary Examiner* — Mark T Le
(74) *Attorney, Agent, or Firm* — Boyle Fredrickson, SC

(57) ABSTRACT

A method and system for detecting and reporting component failures in a linear drive system may identify failed position sensors, failed position magnets, and failed drive coils in the linear drive system. As a mover travels along a track segment in the linear drive system, signals corresponding to the position of the mover and to the current commanded in each drive coil are stored. Analysis of the stored signals identifies whether one of the position sensors along the track segment, one of the position magnets on the movers, or one of the drive coils, used to propel the movers along the track, has failed.

20 Claims, 8 Drawing Sheets

(56) References Cited

U.S. PATENT DOCUMENTS

| | | | | |
|---|---|---|---|---|
| 6,191,507 | B1* | 2/2001 | Peltier | B65G 54/02 |
| | | | | 310/12.02 |
| 6,625,517 | B1* | 9/2003 | Bogdanov | B29C 65/02 |
| | | | | 324/207.21 |
| 7,448,327 | B2 | 11/2008 | Thornton et al. | |
| 8,863,669 | B2 | 10/2014 | Young et al. | |
| 9,346,371 | B2 | 5/2016 | King et al. | |
| 2003/0230941 | A1* | 12/2003 | Jacobs | B60L 15/38 |
| | | | | 310/12.19 |
| 2008/0006172 | A1 | 1/2008 | Thornton | |
| 2015/0028699 | A1* | 1/2015 | Hofstetter | H02K 41/031 |
| | | | | 310/12.31 |
| 2015/0349618 | A1 | 12/2015 | Kleinikkink et al. | |
| 2015/0360581 | A1 | 12/2015 | King et al. | |
| 2017/0346379 | A1* | 11/2017 | Weber | G05B 13/024 |
| 2018/0159416 | A1* | 6/2018 | Julen | B60L 13/03 |
| 2018/0239344 | A1* | 8/2018 | Oka | G05B 19/19 |

\* cited by examiner

METHOD AND APPARATUS TO DIAGNOSE A LINEAR SYNCHRONOUS MOTOR SYSTEM

BACKGROUND INFORMATION

The present invention relates to motion control systems and, more specifically, to diagnosing failure conditions in a linear drive system in a motion control system, where the motion control system incorporates multiple movers propelled along a track using the linear drive system.

Motion control systems utilizing movers and linear motors can be used in a wide variety of processes (e.g. packaging, manufacturing, and machining) and can provide an advantage over conventional conveyor belt systems with enhanced flexibility, extremely high-speed movement, and mechanical simplicity. The motion control system includes a set of independently controlled "movers" each supported on a track for motion along the track. The track is made up of a number of track segments that, in turn, hold individually controllable electric coils. Successive activation of the coils establishes a moving electromagnetic field that interacts with the movers and causes the mover to travel along the track. Sensors may be spaced at fixed positions along the track and/or on the movers to provide information about the position and speed of the movers.

Each of the movers may be independently moved and positioned along the track in response to the moving electromagnetic field generated by the coils. In a typical system, the track forms a closed path over which each mover repeatedly travels. At certain positions along the track other actuators may interact with each mover. For example, the mover may be stopped at a loading station at which a first actuator places a product on the mover. The mover may then be moved along a process segment of the track where various other actuators may fill, machine, position, or otherwise interact with the product on the mover. The mover may be programmed to stop at various locations or to move at a controlled speed past each of the other actuators. After the various processes are performed, the mover may pass or stop at an unloading station at which the product is removed from the mover. The mover then completes a cycle along the closed path by returning to the loading station to receive another unit of the product.

A linear drive system presents challenges for detecting component failures that are not seen in rotary motors or rotary drive systems. Whereas failure of a coil in a stator of a rotary machine is readily observed due to repeated activation and subsequent degradation in performance, failure of a coil in a linear drive system may not be readily observed. A linear drive system includes a number of coils spaced along a track. The coils are activated to cause a mover to travel along the track. Each coil is activated only when a mover passes over the coil. The momentum of the mover allows the mover to continue traveling across any one coil that may fail, and adjacent coils to a failed coil may compensate, at least in part, for a failed coil. However, extra current applied to adjacent coils to compensate for a first, failed coil may result in accelerated failure of those coils.

Similarly, failure of a position sensor in a rotary machine would be readily observed, again due to repeated activation of the sensor as the machine rotates. However, a linear drive system may employ one or more position magnets on each mover and an array of position sensors spaced along the track to detect the position magnets on each mover as it passes. Failure of a single position sensor may go undetected as adjacent position sensors are able to compensate and provide position information for each mover.

Thus, it would be desirable to provide a method and system for detecting and reporting component failures in a linear drive system.

BRIEF DESCRIPTION

The subject matter disclosed herein describes a method and system for detecting and reporting component failures in a linear drive system. According to one feature of the invention, a failure of a position sensor may be detected. Each mover includes at least one position magnet located on the mover. Position sensors are spaced along the track at intervals to detect the position magnets on each mover in order to identify the present location of each mover along the track. As a mover travels along a track segment, the position magnet passes multiple position sensors spaced along the track segment. A position feedback signal, corresponding to the presence of the magnet in the vicinity of the position sensor, is generated by each position sensor and is stored in memory. Each stored position feedback signal is compared to the other stored position feedback signals. A position sensor is identified as having failed when the position feedback signal corresponding to that position sensor differs from the other position feedback signals. According to another feature of the invention, a failure of a position magnet may be detected. A nominal position feedback signal may be stored in memory, and each of the stored position feedback signals may be compared to the nominal position feedback signal. When each of the stored position feedback signals match the other stored position feedback signals but differ from the nominal position feedback signal, the position magnet that passed by each of the position sensors to generate the stored position feedback signals is identified as having failed. According to still another feature of the invention, a failure of a drive coil may be detected. A controller for each track segment generates a current reference signal for each drive coil spaced along the track segment. As a mover travels along the track segment, the current reference signals for each of the drive coils may be stored in memory. Each of the stored current reference signals is compared to the other stored current reference signals. A drive coil may be identified as having failed when the current reference signal corresponding to that drive coil differs from the other current reference signals. Alternately, a current sensor provides a current feedback signal for each coil. The current feedback signal may be compared to the corresponding current reference signal, and a drive coil may be identified as having failed when the current feedback signal does not correspond to the current reference signal.

In one embodiment of the invention, a system for detecting a component failure in a linear drive system is disclosed. The system includes multiple movers and a track. Each of the movers includes at least one position magnet mounted to the mover. The track includes multiple track segments defining a closed path along which each of the movers travels. Each of the track segments includes multiple drive coils and multiple position sensors. The drive coils and the position sensors are spaced along the track segment. Each of the position sensors is operative to detect the position magnet mounted to each mover and to generate a position feedback signal corresponding to the position magnet detected in proximity to the position sensor. The system also includes a memory device operative to store the position feedback signal and a processor in communication with the memory device. The processor receives the position feedback signal from each of the position sensors. The processor is operative to store the position feedback signal from each of the position sensors on one of the track segments in the memory device as a mover travels along the corresponding track segment, compare one cycle of each of the stored position feedback signals to one cycle of each of the other stored position feedback signals, and generate a fault signal when one of the stored position feedback signals differs from the other stored position feedback signals.

According to another embodiment of the invention, a method for detecting a component failure in a linear drive system is disclosed. The linear drive system includes multiple movers operative to travel along a track, and the track includes multiple track segments. A current reference signal is generated for multiple drive coils with a processor for the linear drive system. The drive coils are spaced along one of the track segments and energization of the drive coils causes a first mover, selected from the multiple movers, to travel along the track segment, and a memory device stores the current reference signal for each of the drive coils as the mover travels along the track segment. Multiple position feedback signals are generated, where each position feedback signal is generated by a position sensor spaced along the track segment and is generated responsive to at least one position magnet located on the first mover passing the position sensor as the first mover travels along the track segment. Each of the plurality of position feedback signals is stored in the memory device as the mover travels along the track segment. Each of the stored position feedback signals is compared to each of the other stored position feedback signals with the processor. A fault signal is generated with the processor when one of the stored position feedback signals differs from the other stored position feedback signals.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
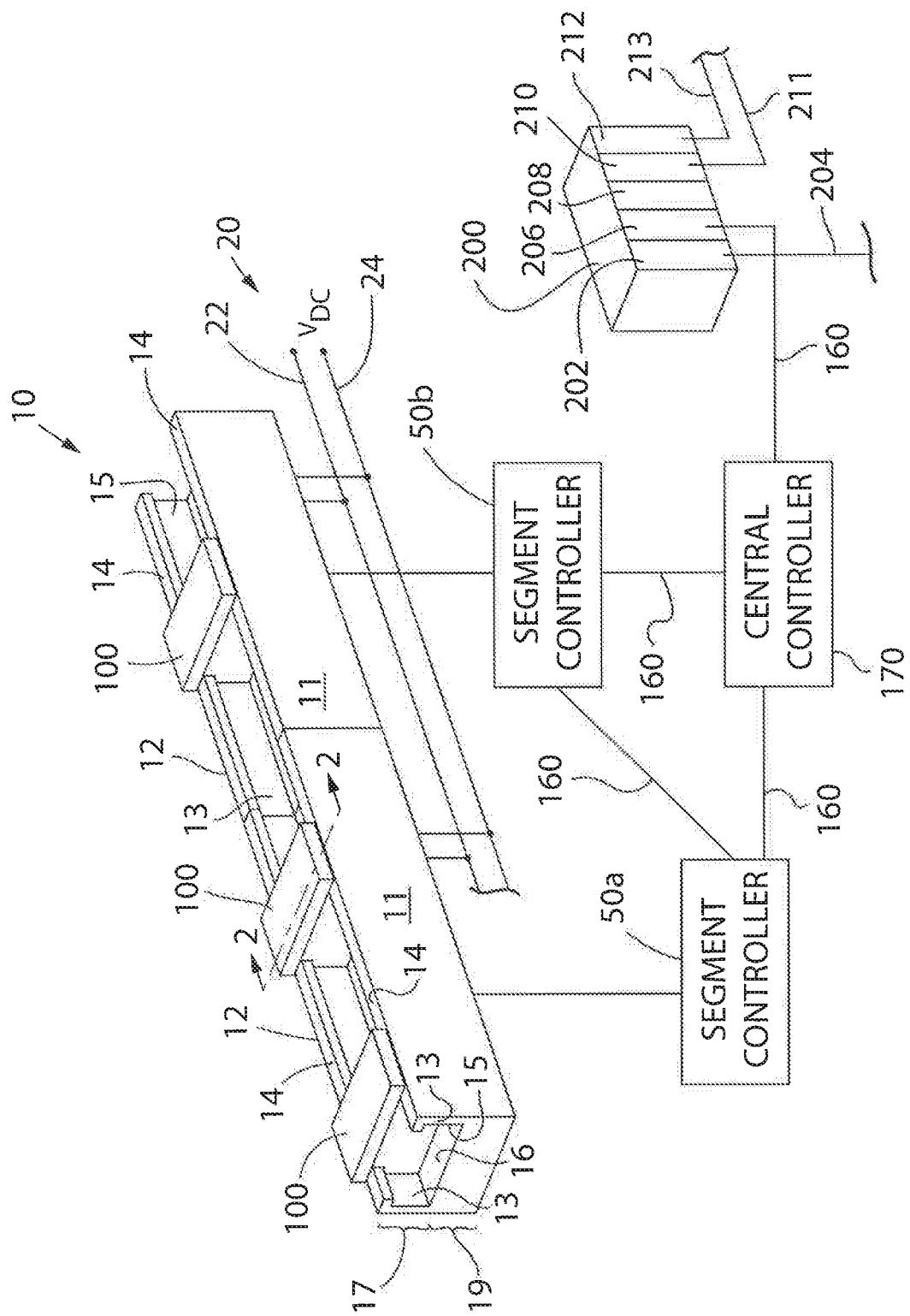
FIG. 1 is a schematic representation of an exemplary control system for a linear drive system according to one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Turning initially to FIGS. 1-4, an exemplary transport system for moving articles or products includes a track 10 made up of multiple segments 12. According to the illustrated embodiment, multiple segments 12 are joined end-to-end to define the overall track configuration. The illustrated segments 12 are both straight segments having generally the same length. It is understood that track segments of various sizes, lengths, and shapes may be connected together to form the track 10 without deviating from the scope of the invention. Track segments 12 may be joined to form a generally closed loop supporting a set of movers 100 movable along the track 10. The track 10 is illustrated in a horizontal plane. For convenience, the horizontal orientation of the track 10 shown in FIG. 1 will be discussed herein. Terms such as upper, lower, inner, and outer will be used with respect to the illustrated track orientation. These terms are relational with respect to the illustrated track and are not intended to be limiting. It is understood that the track may be installed in different orientations, such as sloped or vertical, and include different shaped segments including, but not limited to, straight segments, inward bends, outward bends, up slopes, down slopes and various combinations thereof. The width of the track 10 may be greater in either the horizontal or vertical direction according to application requirements. The movers 100 will travel along the track and take various orientations according to the configuration of the track 10 and the relationships discussed herein may vary accordingly.

According to the illustrated embodiment, each track segment 12 includes an upper portion 17 and a lower portion 19. The upper portion 17 is configured to carry the movers 100 and the lower portion 19 is configured to house the control elements. As illustrated, the upper portion 17 includes a generally u-shaped channel 15 extending longitudinally along the upper portion 17 of each segment. The channel 15 includes a bottom surface 16 and a pair of side walls 13, where each side wall 13 includes a rail 14 extending along an upper edge of the side wall 13. The bottom surface 16, side walls 13, and rails 14 extend longitudinally along the track segment 12 and define a guideway along which the movers 100 travel. According to one embodiment, the surfaces of the channel 15 (i.e., the bottom surface 16, side walls 13 and rails 14) are planar surfaces made of a low friction material along which movers 100 may slide. The contacting surfaces of the movers 100 may also be planar and made of a low friction material. It is contemplated that the surface may be, for example, nylon, Teflon®, aluminum, stainless steel and the like. Optionally, the hardness of the surfaces on the track segment 12 are greater than the contacting surface of the movers 100 such that the contacting surfaces of the movers 100 wear faster than the surface of the track segment 12. It is further contemplated that the contacting surfaces of the movers 100 may be removably mounted to the housing 11 of the mover 100 such that they may he replaced if the wear exceeds a predefined amount. According to still other embodiments, the movers 100 may include low-friction rollers to engage the surfaces of the track segment 12. Optionally, the surfaces of the channel 15 may include different cross-sectional forms with the mover 100 including complementary sectional forms. Various other combinations of shapes and construction of the track segment 12 and mover 100 may be utilized without deviating from the scope of the invention.

According to the illustrated embodiment, each mover 100 is configured to slide along the channel 15 as it is propelled by a linear drive system. The mover 100 includes a body 102 configured to fit within the channel 15. The body 102 includes a lower surface 106, configured to engage the bottom surface 16 of the channel, and side surfaces 108 configured to engage the side walls 13 of the channel. The mover 100 further includes a Shoulder 105 extending inward from each of the side surfaces 108. The shoulder 105 has a width equal to or greater than the width of the rail 14 protruding into the channel. A neck of the mover then extends upward to a top surface 104 of the body 102. The neck extends for the thickness of the rails such that the top surface 104 of the body 102 is generally parallel with the upper surface of each rail 14. The mover 100 further includes a platform 110 secured to the top surface 104 of the body 102. According to the illustrated embodiment, the platform 110 is generally square and the width of the platform 110 is greater than the width between the rails 14. The lower surface of the platform 110, an outer surface of the neck, and an upper surface of the shoulder 105 define a channel 115 in which the rail 14 runs. The channel 115 serves as a guide to direct the mover 100 along the track. It is contemplated that platforms or attachments of various shapes may be secured to the top surface 104 of the body 102. Further, various workpieces, clips, fixtures, and the like may be mounted on the top of each platform 110 for engagement with a product to be carried along the track by the mover 100.

Figure 3:
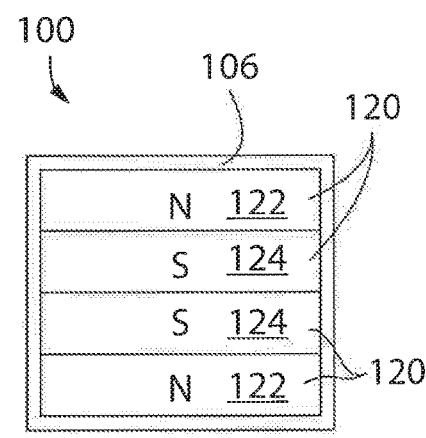
FIG. 3 is a bottom plan view of the exemplary mover of FIG. 2.
Figure 4:
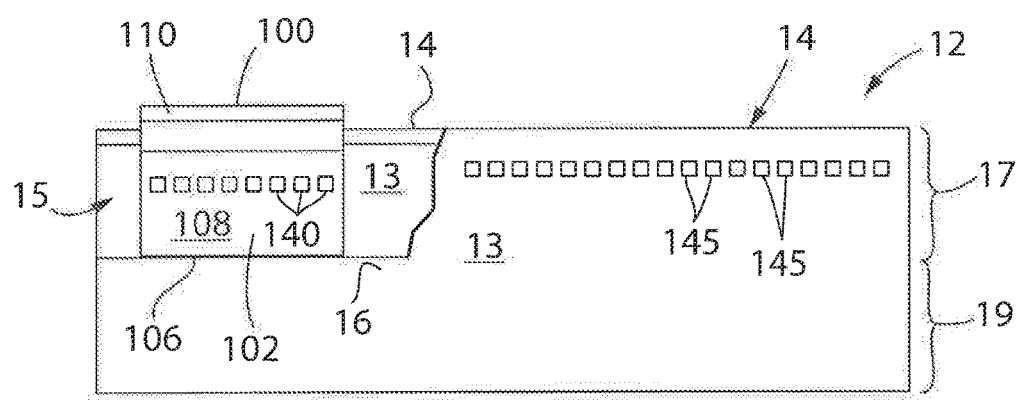
FIG. 4 is a partial side cutaway view of the mover and track segment of FIG. 2.

The mover 100 is carried along the track 10 by a linear drive system. The linear drive system is incorporated in part on each mover 100 and in part within each track segment 12. One or more drive magnets 120 are mounted to each mover 100. With reference to FIG. 3, the drive magnets 120 are arranged in a block on the lower surface of each mover. The drive magnets 120 include positive magnet segments 122, having a north pole, N, facing outward from the mover and negative magnet segments 124, having a south pole, S, facing outward from the mover. According to the illustrated embodiment, two positive magnet segments 122 are located on the outer sides of the set of magnets and two negative magnet segments 124 are located between the two positive magnet segments 122. Optionally, the positive and negative motor segments may be placed in an alternating configuration. In still other embodiments, a single negative magnet segment 124 may be located between the positive magnet segments 122. Various other configurations of the drive magnets 120 may be utilized without deviating from the scope of the invention.

Figure 5:
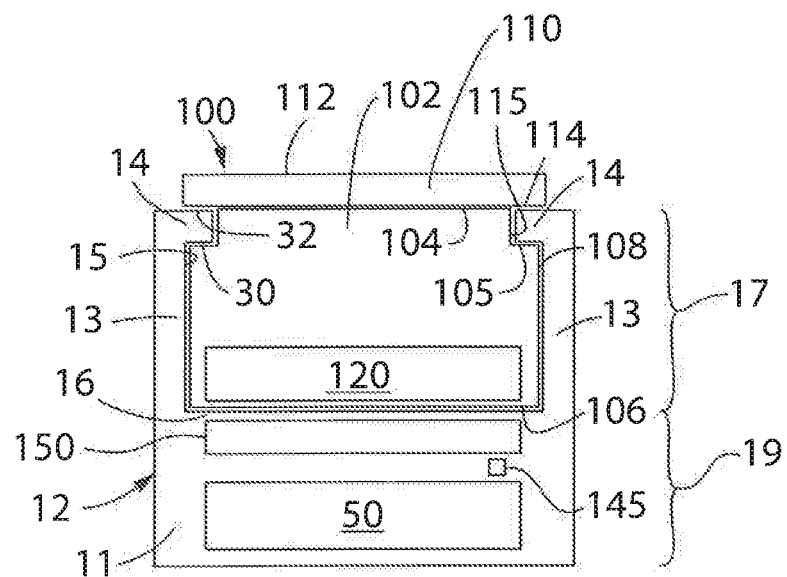
FIG. 5 is a sectional view of another embodiment of a mover and track segment included in the linear drive system taken at 2-2 of FIG. 1.

The linear drive system further includes a series of coils 150 spaced along the length of the track segment 12. With reference also to FIG. 5, the coils 150 may be positioned within a housing 11 for the track segment 12 and below the bottom surface 16 of the channel 15. The coils 150 are energized sequentially according to the configuration of the drive magnets 120 present on the movers 100. The sequential energization of the coils 150 generates a moving electromagnetic field that interacts with the magnetic field of the drive magnets 120 to propel each mover 100 along the track segment 12.

Figure 2:
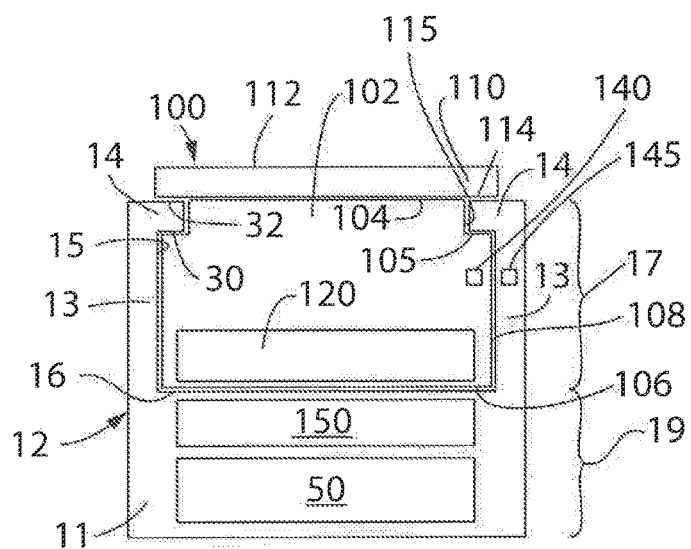
FIG. 2 is a sectional view of one embodiment of a mover and track segment included in the linear drive system taken at 2-2 of FIG. 1.

A segment controller 50 is provided within each track segment 12 to control the linear drive system and to achieve the desired motion of each mover 100 along the track segment 12. Although illustrated in FIG. 1 as blocks external to the track segments 12, the arrangement is to facilitate illustration of interconnects between controllers. As shown in FIG. 2, it is contemplated that each segment controller 50 may be mounted in the lower portion 19 of the track segment 12. Each segment controller 50 is in communication with a central controller 170 which is, in turn, in communication with an industrial controller 200. The industrial controller may be, for example, a programmable logic controller (PLC) configured to control elements of a process line stationed along the track 10. The process line may be configured, for example, to fill and label boxes, bottles, or other containers loaded onto or held by the movers 100 as they travel along the line. In other embodiments, robotic assembly stations may perform various assembly and/or machining tasks on workpieces carried along by the movers 100. The exemplary industrial controller 200 includes: a power supply 202 with a power cable 204 connected, for example, to a utility power supply; a communication module 206 connected by a network medium 160 to the central controller 170; a processor module 208; an input module 210 receiving input signals 211 from sensors or other devices along the process line; and an output module 212 transmitting control signals 213 to controlled devices, actuators, and the like along the process line. The processor module 208 may identify when a mover 100 is required at a particular location and may monitor sensors, such as proximity sensors, position switches, or the like to verify that the mover 100 is at a desired location. The processor module 208 transmits the desired locations of each mover 100 to a central controller 170 where the central controller 170 operates to generate commands for each segment controller 50.

Figure 8:
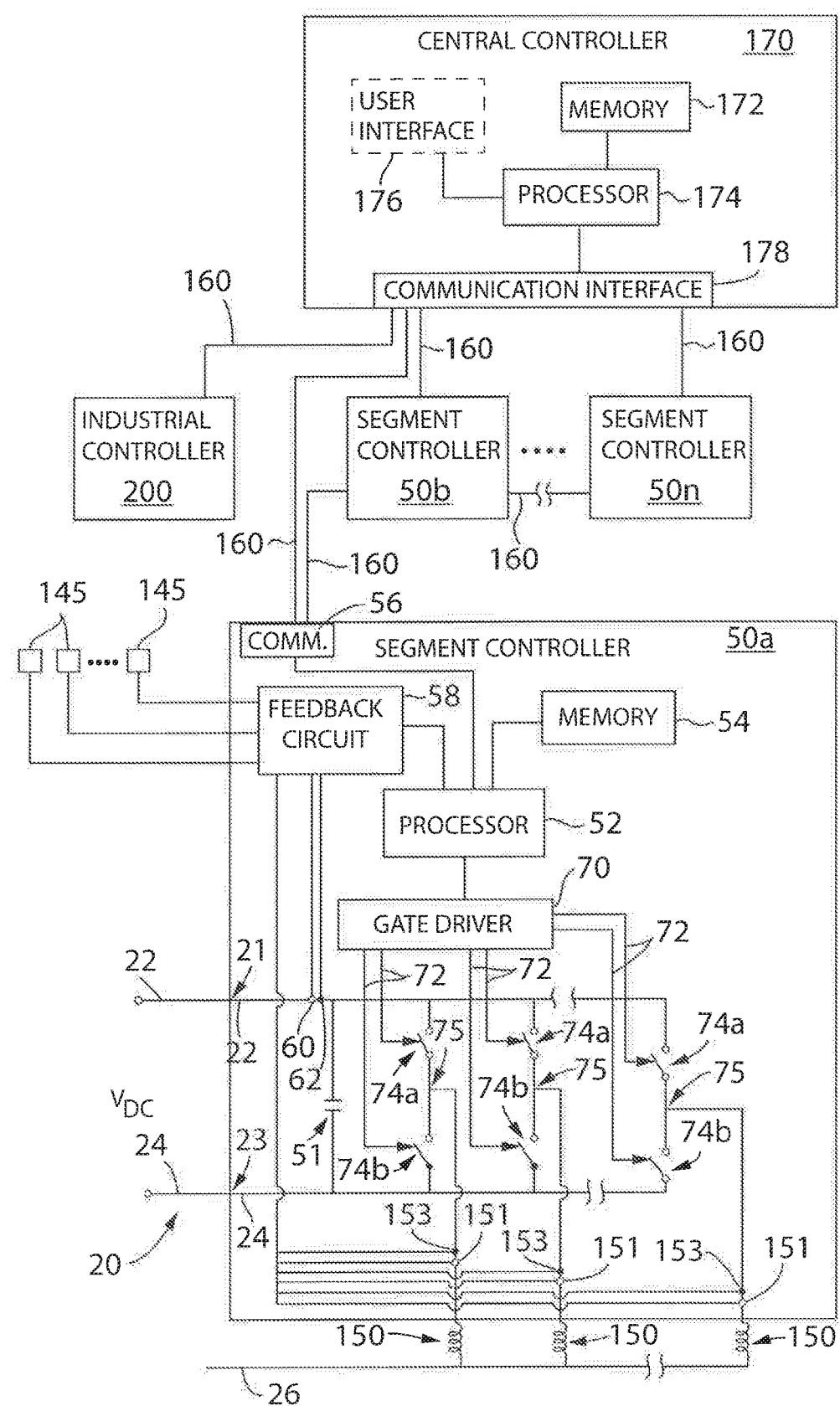
FIG. 8 is a block diagram representation of the exemplary control system of FIG. 1.

With reference also to FIG. 8, the central controller 170 includes a processor 174 and a memory device 172. It is contemplated that the processor 174 and memory device 172 may each be a single electronic device or formed from multiple devices. The processor may be 174 a microprocessor. Optionally, the processor 174 and/or the memory device 172 may be integrated on a field programmable gate array (FPGA) or an application specific integrated circuit (ASIC). The memory device 172 may include volatile memory, non-volatile memory, or a combination thereof. An optional user interface 176 may be provided for an operator to configure the central controller 170 and to load or configure desired motion profiles for the movers 100 on the central controller 170. Optionally, the configuration may be performed via a remote device connected via a network and a communication interface 178 to the central controller 170. It is contemplated that the system controller 170 and user interface 176 may be a single device, such as a laptop, notebook, tablet or other mobile computing device. Optionally, the user interface 176 may include one or more separate devices such as a keyboard, mouse, display, touchscreen, interface port, removable storage medium or medium reader and the like for receiving information from and displaying information to a user. Optionally, the system controller 170 and user interface may be an industrial computer mounted within a control cabinet and configured to withstand harsh operating environments. It is contemplated that still other combinations of computing devices and peripherals as would be understood in the art may be utilized or incorporated into the system controller 170 and user interface 176 without deviating from the scope of the invention.

The central controller 170 includes one or more programs stored in the memory device 172 for execution by the processor 174. The system controller 170 receives a desired position from the industrial controller 200 and determines one or more motion profiles for the movers 100 to follow along the track 10. A program executing on the processor 174 is in communication with each segment controller 50 on each track segment via a network medium 160. The system controller 170 may transfer a desired motion profile to each segment controller 50. Optionally, the system controller 170 may be configured to transfer the information from the industrial controller 200 identifying one or more desired movers 100 to be positioned at or moved along the track segment 12, and the segment controller 50 may determine the appropriate motion profile for each mover 100.

A position feedback system provides knowledge of the location of each mover 100 along the length of the track segment 12 to the segment controller 50. According to one embodiment of the invention, illustrated in FIGS. 2 and 4, the position feedback system includes one or more position magnets 140 mounted to the mover 100 and an array of sensors 145 spaced along the side wall 13 of the track segment 12. The sensors 145 are positioned such that each of the position magnets 140 are proximate to the sensor as the mover 100 passes each sensor 145. The sensors 145 are a suitable magnetic field detector including, for example, a Hall Effect sensor, a magneto-diode, an anisotropic magnetoresistive (AMR) device, a giant magnetoresistive (GMR) device, a tunnel magnetoresistance (TMR) device, fluxgate sensor, or other microelectromechanical (MEMS) device configured to generate an electrical signal corresponding to the presence of a magnetic field. The magnetic field sensor 145 outputs a feedback signal provided to the segment controller 50 for the corresponding track segment 12 on which the sensor 145 is mounted. The feedback signal may be an analog signal 225 of a type illustrated, for example, in FIG. 9. The feedback signal is provided to a feedback circuit 58 which, in turn, provides a signal to the processor 52 which corresponds to the magnet 140 passing the sensor 145.

Figure 6:
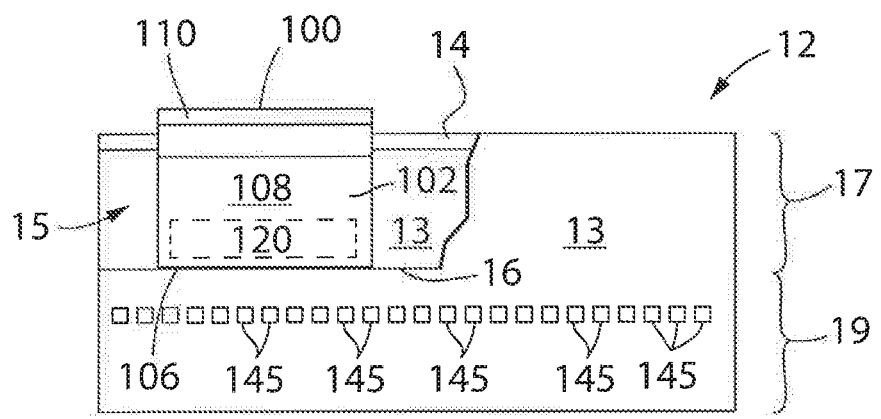
FIG. 6 is a partial side cutaway view of the mover and track segment of FIG. 5.
Figure 7:
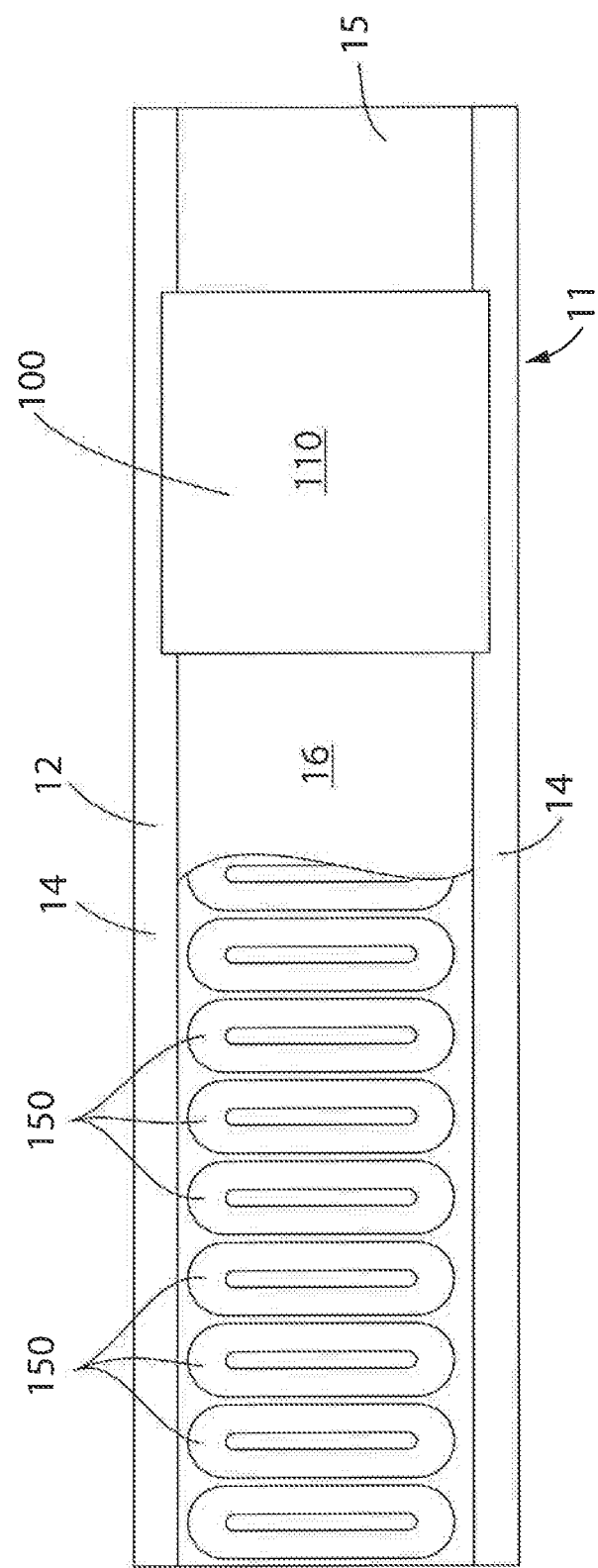
FIG. 7 is a partial top cutaway view of the mover and track segment of FIG. 2.

According to another embodiment of the invention, illustrated in FIGS. 5 and 6, the position feedback system utilizes the drive magnets 120 as position magnets. Position sensors 145 are positioned along the track segment 12 at a location suitable to detect the magnetic field generated by the drive magnets 120. According to the illustrated embodiment, the position sensors 145 are located below the coils 150. Optionally, the position sensors 145 may be interspersed with the coils 150 and located, for example, in the center of a coil or between adjacent coils. According to still another embodiment, the position sensors 145 may be positioned within the upper portion 17 of the track segment 12 and near the bottom surface 16 of the channel 15 to be aligned with the drive magnets 120 as each mover 100 travels along the tracks segment 12. For convenience, operation of the position feedback system will be discussed herein with respect to the position magnets 140 illustrated in FIGS. 2 and 4. However, it is understood that the position feedback system may similarly utilize the drive magnets 120 to detect a position of the mover 100.

The segment controller 50 also includes a communication interface 56 that receives communications from the central controller 170 and/or from adjacent segment controllers 50. The communication interface 56 extracts data from the message packets on the industrial network and passes the data to a processor 52 executing in the segment controller 50. The processor may be a microprocessor. Optionally, the processor 52 and/or a memory device 54 within the segment controller 50 may be integrated on a field programmable gate array (FPGA) or an application specific integrated circuit (ASIC). It is contemplated that the processor 52 and memory device 54 may each be a single electronic device or formed from multiple devices. The memory device 54 may include volatile memory, non-volatile memory, or a combination thereof. The segment controller 50 receives the motion profile or desired motion of the movers 100 and utilizes the motion commands to control movers 100 along the track segment 12 controlled by that system controller 30.

Each segment controller 50 generates switching signals to generate a desired current and/or voltage at each coil 150 in the track segment 12 to achieve the desired motion of the movers 100. The switching signals 72 control operation of switching devices 74 for the segment controller 50. According to the illustrated embodiment, the segment controller 50 includes a dedicated gate driver module 70 which receives command signals from the processor 52, such as a desired voltage and/or current to be generated in each coil 150, and generates the switching signals 72. Optionally, the processor 52 may incorporate the functions of the gate driver module 70 and directly generate the switching signals 72. The switching devices 74 may be a solid-state device that is activated by the switching signal, including, but not limited to, transistors, thyristors, or silicon-controlled rectifiers.

According to the illustrated embodiment, the track receives power from a distributed DC voltage. A DC bus 20 receives a DC voltage, $V_{DC}$, from a DC supply and conducts the DC voltage to each track segment 12. The illustrated DC bus 20 includes two voltage rails 22, 24 across which the DC voltage is present. The DC supply may include, for example, a rectifier front end configured to receive a single or multi-phase AC voltage at an input and to convert the AC voltage to the DC voltage. It is contemplated that the rectifier section may be passive, including a diode bridge or, active, including, for example, transistors, thyristors, silicon-controlled rectifiers, or other controlled solid-state devices. Although illustrated external to the track segment 12, it is contemplated that the DC bus 20 would extend within the lower portion 19 of the track segment. Each track segment 12 includes connectors to which either the DC supply or another track segment may be connected such that the DC bus 20 may extend for the length of the track 10. Optionally, each track segment 12 may be configured to include a rectifier section (not shown) and receive an AC voltage input. The rectifier section in each track segment 12 may convert the AC voltage to a DC voltage utilized by the corresponding track segment.

The DC voltage from the DC bus 20 is provided at the input terminals 21, 23 to a power section for the segment controller. A first voltage potential is present at the first input terminal 21 and a second voltage potential is present at the second input terminal 23. The DC bus extends into the power section defining a positive rail 22 and a negative rail 24 within the segment controller. The terms positive and negative are used for reference herein and are not meant to be limiting. It is contemplated that the polarity of the DC voltage present between the input terminals 21, 23 may be negative, such that the potential on the negative rail 24 is greater than the potential on the positive rail 22. Each of the voltage rails 22, 24 are configured to conduct a DC voltage having a desired potential, according to application requirements. According to one embodiment of the invention, the positive rail 22 may have a DC voltage at a positive potential and the negative rail 24 may have a DC voltage at ground potential. Optionally, the positive rail 22 may have a DC voltage at ground potential and the negative rail 24 may have a DC voltage at a negative potential According to still another embodiment of the invention, the positive rail 22 may have a first DC voltage at a positive potential with respect to the ground potential and the negative rail 24 may have a second DC voltage at a negative potential with respect to the ground potential. The resulting DC voltage potential between the two rails 22, 24 is the difference between the potential present on the positive rail 22 and the negative rail 24.

It is further contemplated that the DC supply may include a third voltage rail 26 having a third voltage potential. According to one embodiment of the invention, the positive rail 22 has a positive voltage potential with respect to ground, the negative rail 24 has a negative voltage potential with respect to ground, and the third voltage rail 26 is maintained at a ground potential. Optionally, the negative voltage rail 24 may be at a ground potential, the positive voltage rail 22 may be at a first positive voltage potential with respect to ground, and the third voltage rail 26 may be at a second positive voltage potential with respect to ground, where the second positive voltage potential is approximately one half the magnitude of the first positive voltage potential. With such a split voltage DC bus, two of the switching devices 74 may be used in pairs to control operation of one coil 150 by alternately provide positive or negative voltages to one the coils 150.

The power section in each segment controller 50 may include multiple legs, where each leg is connected in parallel between the positive rail 22 and the negative rail 24. According to the illustrated embodiment, three legs are shown. However, the number of legs may vary and will correspond to the number of coils 150 extending along the track segment 12. Each leg includes a first switching device 74a and a second switching device 74b connected in series between the positive rail 22 and the negative rail 24 with a common connection 75 between the first and second switching devices 74a, 74b. The first switching device 74a in each leg 221 may also be referred to herein as an upper switch, and the second switching device 74b in each leg 221 may also be referred to herein as a lower switch. The terms upper and lower are relational only with respect to the schematic representation and are not intended to denote any particular physical relationship between the first and second switching devices 74a, 74b. The switching devices 74 include, for example, power semiconductor devices such as transistors, thyristors, and silicon controlled rectifiers, which receive the switching signals 72 to turn on and/or off. Each of switching devices may further include a diode connected in a reverse parallel manner between the common connection 75 and either the positive or negative rail 22, 24.

The processor 52 also receives feedback signals from sensors providing an indication of the operating conditions within the power segment or of the operating conditions of a coil 150 connected to the power segment. According to the illustrated embodiment, the power segment includes a voltage sensor 62 and a current sensor 60 at the input of the power segment. The voltage sensor 62 generates a voltage feedback signal and the current sensor 60 generates a current feedback signal, where each feedback signal corresponds to the operating conditions on the positive rail 22. The segment controller 50 also receives feedback signals corresponding to the operation of coils 150 connected to the power segment. A voltage sensor 153 and a current sensor 151 are connected in series with the coils 150 at each output of the power section. The voltage sensor 153 generates a voltage feedback signal and the current sensor 151 generates a current feedback signal, where each feedback signal corresponds to the operating condition of the corresponding coil 150. The processor 52 executes a program stored on the memory device 54 to regulate the current and/or voltage supplied to each coil and the processor 52 and/or gate driver module 70 generates switching signals 72 which selectively enable/disable each of the switching devices 74 to achieve the desired current and/or voltage in each coil 150. The energized coils 150 create an electromagnetic field that interacts with the drive magnets 120 on each mover 100 to control motion of the movers 100 along the track segment 12.

In operation, the central controller 170 coordinates motion of the movers 100 along each track segment 12. The central controller 170 receives a command from an external controller, such as the industrial controller 200 shown in FIG. 1, corresponding to a desired location or to a desired trajectory for each mover 100. The central controller 170 may relay the desired location or desired trajectory directly to the appropriate segment controller 50 with the corresponding mover 100 present along the track segment 12. Optionally, the central controller 170 may perform some initial processing on the command and generate, for example, a motion profile, a speed command, a position command, or the like for a mover 100 and transmit the processed command to the corresponding segment controller 50.

The segment controller 50 receives the command for each mover 100 present along the corresponding track segment 12 and controls operation of the mover 100 to achieve the desired command. The segment controller 50 may include a position and/or velocity loop to regulate the position of each mover 100. Each mover 100 includes at least one position magnet 140 and, according to the illustrated embodiment, each mover 100 includes an array of position magnets 140 mounted on the mover 100. The position magnets 140 pass by an array of position sensors 145 as the mover 100 travels along the track segment, generating position feedback signals 225. A position loop may utilize the position feedback signals 225 directly to regulate the position of the mover 100 to achieve a desired position or desired position profile along the track segment 12. The processor 52. In the segment controller 50 may also convert the position feedback signals 225 to a velocity feedback signal according to known methods and provide the velocity feedback signal to a velocity loop to achieve a desired speed or desired speed profile along the track segment 12.

Figure 9:
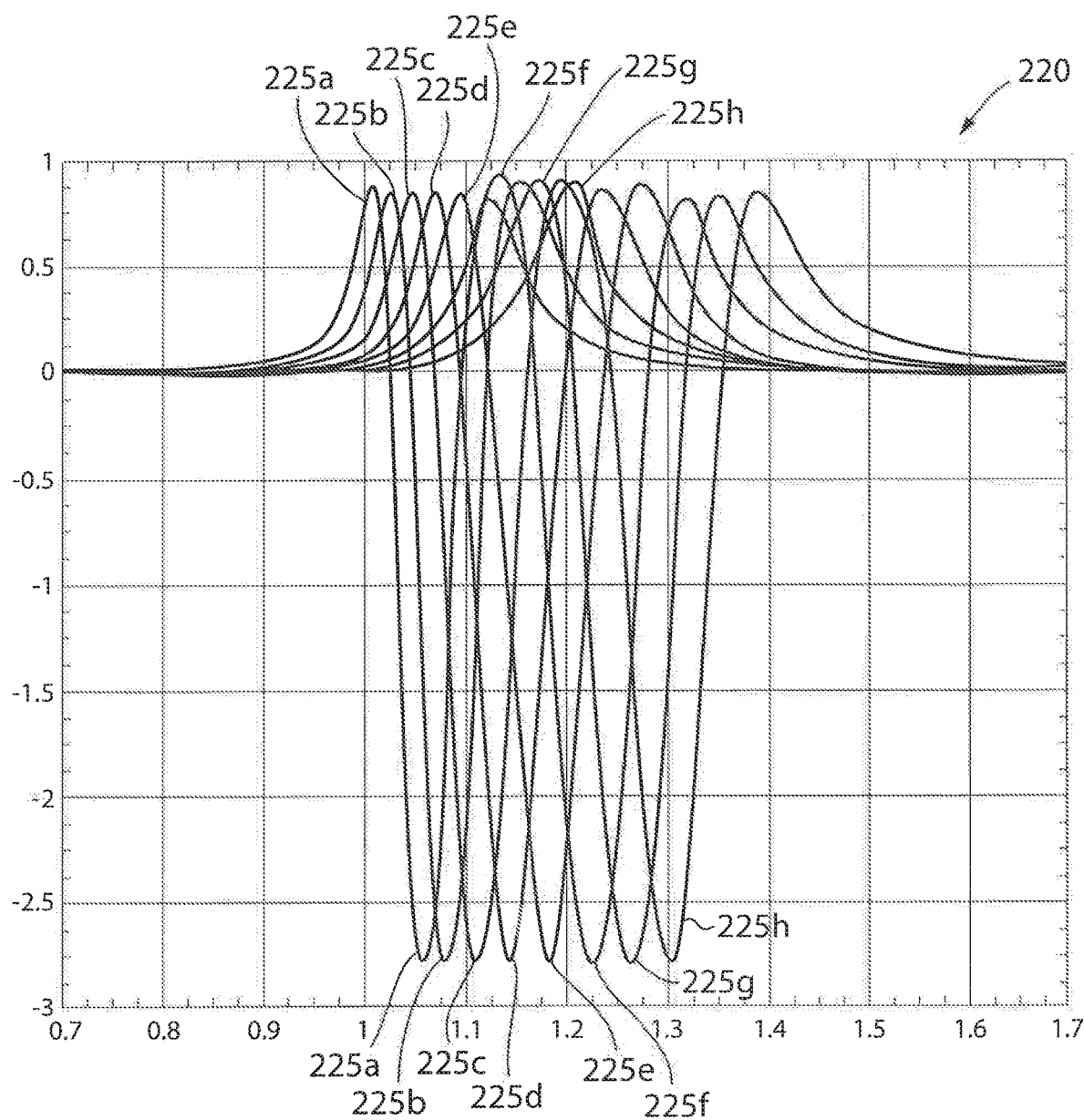
FIG. 9 is a graphical representation of multiple position sensor feedback signals.

Referring to FIG. 9, multiple position feedback signals 225 are illustrated on a single graph 220. Each position feedback signal 225a-225h corresponds to a position magnet 140 passing a position sensor 145. The graph 220 is representative of two different scenarios. The graph 220 first may represent a single position magnet 140 passing multiple position sensors 145. Each position feedback signal 225a-225h corresponds to a different position sensor 145. Alternately, the graph 220 may represent multiple position magnets 140 passing a single position sensor 145. Each position feedback signal 225a-225h corresponds to a different position magnet 140. As will be discussed in more detail below, the position feedback signals 225 may be stored in memory 54 on the segment controller 50 to detect a failure in either a position magnet 140 or in a position sensor 145.

The output of the position and/or velocity loops may he converted to a current reference and provided to a current regulator within the segment controller 50. The current reference corresponds to a current required by one or more of the coils 150 in the track segment 12 to maintain the desired position or velocity of the mover 100 along the track segment 12. The current regulator receives the current reference and current feedback signals and generates an output signal for the gate driver module 70, which, in turn, generates switching signals 72 to supply the desired current to each coil 150 to achieve the desired position or velocity profile for each mover 100 on the track segment 12.

Figure 11:
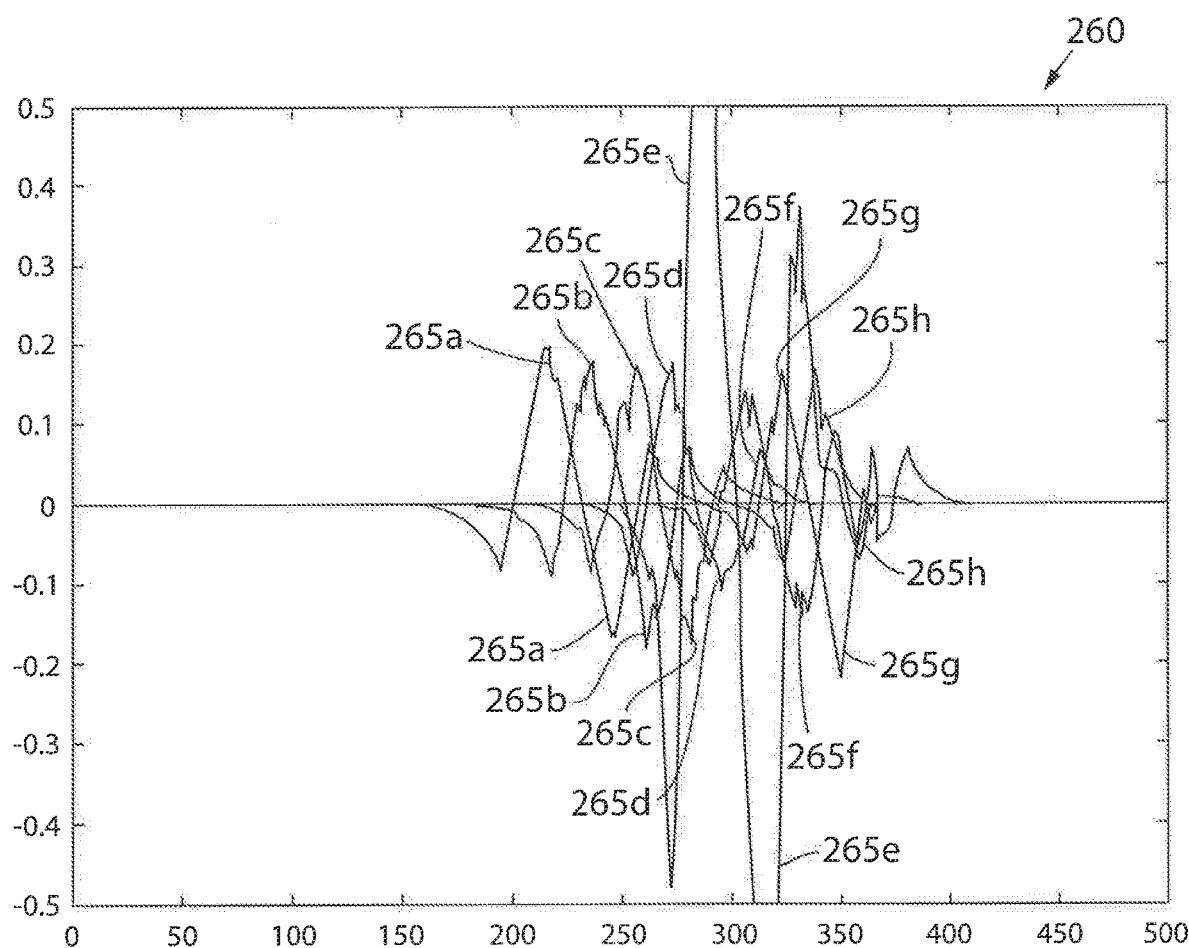
FIG. 11 is a graphical representation of multiple current sensor feedback signals.

Referring to FIG. 11, multiple current feedback signals 265 are illustrated on a single graph 260. Each current feedback signal 265 corresponds to the coil present in one of the coils 150 on the track segment. The graph 260 illustrates the current present in eight adjacent coils 150 as a mover 100 is commanded to traverse the portion of the track segment 12 containing these coils 150. Each current feedback signal 265a-265h corresponds to a current present in a different coil 150. As will be discussed in more detail below, the current reference and the current feedback signals 265 may used to detect a failure of one of the coils 150.

As indicated above, the position feedback signals 225 may be stored in memory 54 on the segment controller 50 to detect a failure in either a position magnet 140 or in a position sensor 145. As a mover 100 travels along a track segment 12, the segment controller 50 is configured to store position feedback signals 225 from each position sensor 145 located along the track segment 12. If a mover 100 has a single position magnet 140, a single set of feedback signals 225 for the magnet 140 is stored for each position sensor 145. If a mover 100 includes an array of magnets 140, then a separate feedback signal 225 is stored for each position magnet 140 as it passes each sensor 145. In other words, if a mover 100 includes four position magnets 140 and a track segment 12 includes eight sensors 145 spaced along its length, then thirty-two feedback signals 225 will be stored in the memory 54 for each mover 100 as it passes along the track segment 12. According to one embodiment of the invention, the memory 54 may include a table with memory allocated for each mover 100 and each position magnet 140 located on the mover 100. According to another embodiment of the invention, the memory 54 may include a table with memory allocated for a single mover 100. The processor 52 may be configured to store an identifier of each mover as it travels along the track segment 12 and associate the identifier with the set of feedback signals 225. Thus, further evaluation of the feedback signals 225 may identify a particular mover 100 with which a particular failure may be associated.

Figure 10:
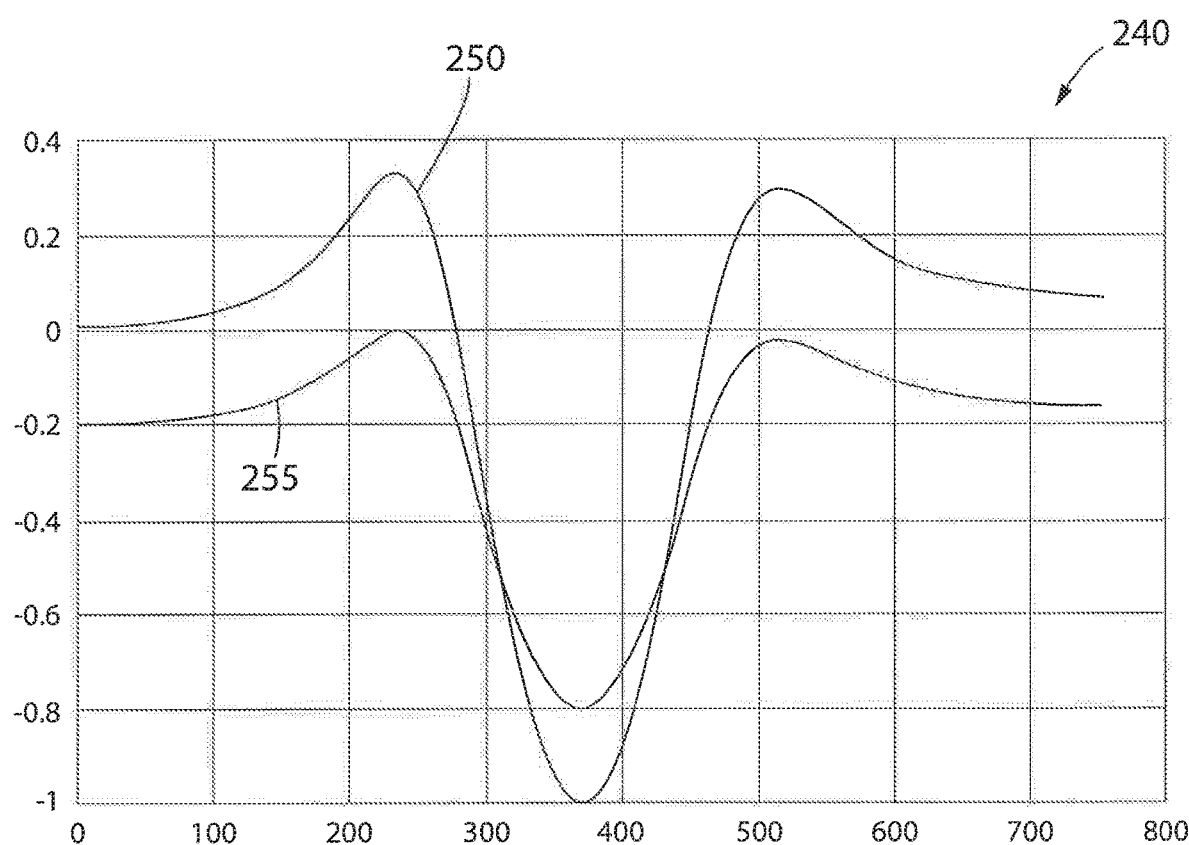
FIG. 10 is a graphical representation of a nominal position feedback signal compared to a non-ideal position feedback signal.

With reference also to FIG. 10, a nominal position feedback signal 250 may be stored in the memory device. The nominal position feedback signal 250 provides an indication of an ideal waveform for a feedback signal 225 generated by the position sensor 145 as each position magnet 140 passes.

FIG. 10 also includes a non-ideal position feedback signal 255 for comparison. If the non-ideal position feedback signal 255 is compared to the nominal position feedback signal 250, for example, at the zero position along the horizontal axis, this position corresponds to a position feedback signal 225 that is generated when no position magnet is proximate to the position sensor 145. At the zero position, the nominal position feedback signal 250 is equal to zero. However, the non-ideal position feedback signal 255 is equal to a negative two-tenths, indicating an offset error in the non-ideal position feedback signal 255. Further, the difference between the maximum and minimum values of the nominal position feedback signal 250 is approximately one and three-tenths. However, the difference between the maximum and minimum values of the non-ideal position feedback signal 255 is approximately one, indicating a gain error in the non-ideal position feedback signal 255. Comparing a position feedback signal 225 to the nominal feedback signal 250 can, therefore, identify errors in the gain and/or offset present on a particular feedback sensor 145.

It is contemplated that the nominal position feedback signal 250 may be utilized to generate a compensation table for each of the position sensors 145 on the track segment 12. During a commissioning process, a mover 100 having a position magnet 140 generating a known magnetic field may be passed by the position feedback sensors 145 on the track segment 12. Each of the position feedback signals 225 generated as the known position magnet 140 passes one of the position feedback sensors 145 is compared to the nominal position feedback signal 250. A difference between the values at the zero location may be stored in the compensation table for each sensor 145 to provide offset compensation and a difference between the maximum and minimum values may be stored in the compensation table for each sensor 145 to provide gain compensation. After the commissioning run and during normal operation, the processor 52 may add the offset compensation value to a feedback signal 225 or multiple a feedback signal 225 by the gain compensation value for each sensor 145 to generate a compensated feedback signal that corresponds to the nominal feedback signal 250 for each position sensor 145.

During operation and as each mover 100 is being controlled to travel along the track segment 12, the processor 52 monitors the stored values of the position feedback signals 225 to detect when one of the position feedback sensors 145 has failed. After each mover 100 passes along a track segment 12, the processor compares the stored position feedback signal 225 from each position sensor 145 corresponding to one of the position magnets 140 to the other position feedback signals 225 from each of the other position sensors 145 along the track segment for the same position magnet 140. If one of the position feedback signals does not match the other position feedback signals, the processor 52 identifies the position sensor 145 from which the different position feedback signal was generated as having failed. The shape of the position feedback signals 225 are compared, for example, by comparing either the offsets or the peak-to-peak amplitude of each position feedback signal to the offsets or the peak-to-peak amplitude of each of the other position feedback signals. The processor 52 may include a single threshold against which a deviation is compared, and when the difference between one position feedback signal and the other position feedback signals exceeds the threshold, the position feedback sensor 145 is identified as having failed. Optionally, the processor 52 may include a pair of thresholds, where a first threshold identifies a position feedback sensor 145 as being close to failure and a second threshold identifies the position feedback sensor 145 as having failed. According to still another embodiment of the invention, if the processor includes a compensation table and the position feedback signals 225 are being compensated as each signal is generated, each position feedback signal 225 may be compared to the nominal position feedback signal 250. A deviation in the offset or peak-to-peak value of the position feedback signal 225 after the initial commissioning run has been completed indicates that the position feedback sensor 145 has failed.

During operation and as each mover 100 is being controlled to travel along the track segment 12, the processor 52 may also monitor the stored values of the position feedback signals 225 to detect when a position magnet 140 on one of the movers 100 has failed. After comparing the stored position feedback signal 225 from each position sensor 145 corresponding to one of the position magnets 140 to the other position feedback signals 225 from each of the other position sensors 145 along the track segment for the same position magnet 140, the controller 50 will typically determine that each of the position feedback signals 225 are the same. In other words, if one of the position feedback sensors 145 has not failed, then each should generate a position feedback signal 225 that matches the other position feedback signals 225, within expected tolerances, for the same position magnet 140 passing by the position feedback sensors 145. However, the processor 52 may perform an additional comparison to determine whether the position magnet 140 has failed. The processor 52 compares one of the position feedback signals 225 to the nominal position feedback signal 250. If the position feedback signal 225 does not match the nominal position feedback signal 250 and the position feedback signal 225 matched the position feedback signals generated by each of the other position sensors 145 on the track segment 12, the processor 52 determines that the position magnet 140 has failed. The magnetic field generated by the position magnet 140 may have been weakened, for example, due to shock, heat, or other environmental conditions and, as a result, the position sensors 145 may no longer generate the same position feedback signal 225 for the failed position magnet 140. The processor 52 may include a single threshold against which a deviation is compared, and when the difference between the position feedback signal and the nominal position feedback signals exceeds the threshold, the position magnet 140 is identified as having failed. Optionally, the processor 52 may include a pair of thresholds, where a first threshold identifies a position magnet 140 as being close to failure and a second threshold identifies the position magnet 140 as having failed.

According to still another embodiment of the invention, the position feedback sensors 145 are spaced apart along the track segment 12 at a fixed interval. Because each of the position sensors 145 generate the same signal for the same position magnet 140 as it passes each position sensor, the position feedback signal 225 generated by two adjacent position sensors 145 will have a known phase lag corresponding to the interval at which the sensors 145 are spaced apart. The processor 52 may utilize the position feedback signals 225 from adjacent position feedback sensors 145 to determine a phase angle between the two feedback signals 225. If the feedback signals are the same, the phase angle should be constant. If one of the position feedback sensors generates a position feedback signal 225 having a different shape than the other, the phase angle between the feedback signals of two adjacent sensors 145 will vary as the position magnet 140 passes the adjacent sensors 145. The processor 52 may be configured to monitor the phase angle between adjacent sensors as a position magnet 140 passes the sensors to detect the failure of one of the sensors 145. The failed sensor 145 may be identified as a middle sensor of three sensors 145 when the phase angle for a failed sensor 145 varies with both adjacent sensors 145. Monitoring the phase angle of the position feedback signals 225 between two adjacent sensors 145 allows the processor 52 to detect additional failure modes of a position sensor 145 beyond an offset error or a gain error.

During operation and as each mover 100 is being controlled to travel along the track segment 12, the processor 52 may also monitor the current feedback signals 265 generated by a current sensor 151. As a mover 100 travels along a track segment 12, the segment controller 50 may be configured to store in memory 54 the current feedback signals 265 from each coil 150 located along the track segment 12 corresponding to one mover 100 passing the coil 150. The processor 52 may also be configured to store in memory 54 a current reference signal for each coil 150 corresponding to the desired current present in the coil as the mover 100 travels over the coil.

According to one embodiment of the invention, the processor 52 utilizes the stored values of the current to determine whether one of the coils 150 in the tracks segment 12 has failed. The current feedback signal 265 for one coil is compared to the current reference signal for the same coil 150 as a mover 100 traverses the coil. If the magnitude of the current feedback signal 265 differs from the magnitude of the current reference signal, the processor 52 may identify the coil 150 as having failed.

According to another embodiment of the invention, the processor 52 may be configured to compare the current reference signal for one coil 150 directly to the current feedback signal 265 corresponding to the current present in the corresponding coil 150. In some embodiments, this comparison may be performed in the current regulator executing on the segment controller 50. The current regulator determines a current error signal which indicates the difference between the current reference and the current feedback signals. Alternately, the comparison may be performed independently of the current regulator. If the current error signal exceeds a threshold, the processor 52 identifies that the corresponding coil 150 has failed. Optionally, the processor 52 may include a pair of thresholds, where a first threshold identifies a coil 150 as being close to failure and a second threshold identifies the coil 150 as having failed.

In still other embodiments, the stored current feedback signals 265 from each coil 150 along a track segment 12 may be compared to each other. Although there may be some variation in the expected current between coils, for example, due to acceleration or deceleration of a mover 100 along the track segment 12, the expected variation between adjacent coils 150 (as opposed to coils 150 on each end of the track segment 12) will be reduced. Additional variation in current may also result from loading or unloading of a work piece on the mover 100. While these variations may result in step changes in current between adjacent coils 150, these variations would be known according to the application requirements. The memory 54 may store a parameter indicating an expected maximum change in current between coils 150 over a track segment 12, between adjacent coils 150 along the track segment 12, or both. Alternately, the expected change between coils 150 may be determined as a function of the position or speed profile for the mover 100 over the track segment 12. The processor 52 may compare the current feedback signals 265 to each other, and if the variation between coils 150 or between adjacent coils exceeds an expected maximum variation, the processor 52 may identify a coil 150 as having failed.

According to another aspect of the invention, the central controller 170 may include a display device as part of the user interface 176. Optionally, the central controller 170 or each segment controller 50 may be in communication via the industrial network and/or a standard network, such as the internet, with another computing device having a display. The stored position feedback signals 225 and/or the stored current feedback signals 265 may be transmitted from each segment controller 50 to the central controller or to the other computing device and displayed on the display device.

It should he understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

I claim:

1. A system for detecting a component failure in a linear drive system, comprising:
    a plurality of movers, wherein each of the plurality of movers includes at least one position magnet mounted to the mover;
    a track including a plurality of track segments defining a closed path along which each of the plurality of movers travels, wherein each of the plurality of track segments includes:
        a plurality of drive coils spaced along the track segment; and
        a plurality of position sensors spaced along the track segment, wherein each of the position sensors is operative to detect the at least one position magnet mounted to each mover and to generate a position feedback signal corresponding to the at least one position magnet detected in proximity to the position sensor;
    a memory device operative to store the position feedback signal; and
    a processor in communication with the memory device, wherein the processor receives the position feedback signal from each of the plurality of position sensors and wherein the processor is operative to:
    store the position feedback signal from each of the plurality of position sensors on one of the track segments in the memory device as a mover travels along the corresponding track segment,
    compare one cycle of each of the stored position feedback signals to one cycle of each of the other stored position feedback signals, and
    generate a fault signal when one of the stored position feedback signals differs from the other stored position feedback signals.

2. The system of claim 1 wherein:
    the memory device is operative to store a nominal position feedback signal,
    the processor stores the position feedback signal from each of the plurality of position sensors, and
    the position feedback signal stored from each of the plurality of position sensors is compared to the nominal position feedback signal.

3. The system of claim 2 wherein the processor is further operative to identify the at least one position magnet as failed when the position feedback signals from each of the position sensors on one of the track segments matches the position feedback signals from each of the other position sensors on the track segment and when the position feedback signals from each of the position sensors on one of the track segments differs from the nominal position feedback signal.

4. The system of claim 2 wherein the processor is further operative to identify one of the plurality of position sensors as failed when the corresponding position feedback signal from the identified position sensor differs from the position feedback signals from each of the other position sensors on the track segment.

5. The system of claim 4 wherein the processor is further operative to:
    read the position feedback signal from each of the position sensors when no position magnet is proximate the corresponding position sensor,
    obtain a stored value from the nominal position feedback signal corresponding to the absence of the position magnet, and
    identify an offset error for at least one of the position sensors when the value of the position feedback signal for the corresponding position sensor is not equal to the stored value from the nominal position feedback signal.

6. The system of claim 4 wherein the processor is further operative to:
    read a minimum value and a maximum value of the position feedback signal during one pass of the position magnet past the position sensor,
    read a minimum value and a maximum value of the nominal position feedback signal during one pass of the position magnet past the position sensor,
    identify a gain error for at least one of the position sensors when a difference between the maximum value and the minimum value of the position feedback signal for the corresponding position sensor is not equal to a difference between the maximum value and the minimum value of the nominal position feedback signal.

7. The system of claim 1 wherein the processor is further operative to:
    read the position feedback signal from two adjacent position sensors,
    determine a phase relationship between the position feedback signals from the two adjacent position sensors, and
    generate a fault signal when the phase relationship varies from an expected phase relationship.

8. The system of claim 1 wherein the processor is further operable to:
    store a current reference signal for each of the plurality of drive coils on one of the track segments as one of the plurality of movers travels along the track segment, wherein each current reference signal corresponds to a desired current in the corresponding drive coil, and
    identify one of the plurality of drive coils as failed when the corresponding current reference signal for the drive coil differs from the current reference signals for each of the other drive coils on the track segment.

9. The system of claim 1 wherein each of the track segments further includes a segment controller and wherein the memory device and the processor are included in the segment controller.

10. The system of claim 1 further comprising a central controller in communication with each of the track segments, wherein the memory device and the processor are included in the central controller.

11. The system of claim 1 further comprising a visual display unit wherein the position feedback signals stored in the memory device are graphically represented on the visual display unit.

12. A method for detecting a component failure in a linear drive system, wherein the linear drive system includes a plurality of movers operative to travel along a track and wherein the track includes a plurality of track segments, the method comprising the steps of:
  generating a current reference signal for each of a plurality of drive coils with a processor for the linear drive system, wherein the plurality of drive coils are spaced along one of the track segments and wherein energization of the drive coils causes a first mover, selected from the plurality of movers, to travel along the track segment;
  storing in a memory device the current reference signal for each of the plurality of drive coils as the mover travels along the track segment;
  generating a plurality of position feedback signals, wherein each of the plurality of position signals is generated by a position sensor spaced along the track segment and is generated responsive to at least one position magnet located on the first mover passing the position sensor as the first mover travels along the track segment;
  storing in the memory device each of the plurality of position feedback signals as the mover travels along the track segment;
  comparing each of the stored position feedback signals to each of the other stored position feedback signals with the processor; and
  generating a fault signal with the processor when one of the stored position feedback signals differs from the other stored position feedback signals.

13. The method of claim 12 further comprising the steps of:
  storing a nominal position feedback signal in the memory device; and
  comparing each of the stored position feedback signals to the nominal position feedback signal with the processor.

14. The method of claim 13 further comprising the step of identifying the at least one position magnet as failed when the position feedback signals from each of the position sensors on the track segment matches the position feedback signals from each of the other position sensors on the track segment and when the position feedback signals from each of the position sensors on the track segments differs from the nominal position feedback signal.

15. The method of claim 13 further comprising the step of identifying one of the position sensors as failed when the corresponding position feedback signal from the identified position sensor differs from the position feedback signals from each of the other position sensors on the track segment.

16. The method of claim 12 further comprising the steps of:
  reading the position feedback signal from two adjacent position sensors;
  determining a phase relationship between the position feedback signals from the two adjacent position sensors, and
  generating a fault signal when the phase relationship varies from an expected phase relationship.

17. The method of claim 12 further comprising the steps of:
  storing the current reference signal for each of the plurality of drive coils on one of the track segments as one of the plurality of movers travels along the track segment, wherein each current reference signal corresponds to a desired current in the corresponding drive coil, and
  identifying one of the plurality of drive coils as failed when the corresponding current reference signal for the drive coil differs from the current reference signals for each of the other drive coils on the track segment.

18. The method of claim 12 wherein the linear drive system includes a segment controller in each of the track segments and wherein the memory device and the processor are included in the segment controller.

19. The method of claim 12 wherein the linear drive system includes a central controller in communication with each of the track segments and wherein the memory device and the processor are included in the central controller.

20. The method of claim 12 wherein the linear drive system includes a visual display unit and wherein the position feedback signals stored in the memory device are graphically represented on the visual display unit.

* * * * *